United States Patent
Sugiura (10) Patent No.: US 7,039,360 B2
(45) Date of Patent: May 2, 2006

(54) EXTERNAL NOISE INTRUSION PREVENTION DEVICE, SIGNAL AMPLIFIER, PROTECTOR AND ANTENNA PLUG

(75) Inventor: Toshihiro Sugiura, Nisshin (JP)

(73) Assignee: Maspro Denkoh Co., Ltd., Nisshin (JP)

( * ) Notice: Subject to any disclaimer, the term of this patent is extended or adjusted under 35 U.S.C. 154(b) by 596 days.

(21) Appl. No.: 10/054,187

(22) Filed: Jan. 22, 2002

(65) Prior Publication Data

US 2002/0100060 A1 Jul. 25, 2002

(51) Int. Cl.
*H04B 1/00* (2006.01)

(52) U.S. Cl. .................. 455/63.1; 455/114.2; 455/501; 455/570; 455/222; 455/278.1; 455/283; 455/296; 307/89

(58) Field of Classification Search ............... 455/63.1, 455/114.2, 501, 570, 222, 278.1, 283, 296, 455/310; 307/89
See application file for complete search history.

(56) References Cited

U.S. PATENT DOCUMENTS

| | | | | |
|---|---|---|---|---|
| 4,872,145 A | * | 10/1989 | Culbert et al. | 455/283 |
| 5,559,377 A | * | 9/1996 | Abraham | 455/280 |
| 5,736,916 A | * | 4/1998 | Vlahu | 336/69 |
| 6,104,707 A | * | 8/2000 | Abraham | 370/295 |
| 6,396,392 B1 | * | 5/2002 | Abraham | 340/310.01 |
| RE38,082 E | * | 4/2003 | Vlahu | 336/69 |
| 6,711,385 B1 | * | 3/2004 | Abraham | 455/80 |

* cited by examiner

*Primary Examiner*—Joseph Feild
*Assistant Examiner*—Huy D. Nguyen
(74) *Attorney, Agent, or Firm*—Burr & Brown (57) ABSTRACT

An external noise intrusion prevention device preventing intrusion of external noise into a central conductor of a trunk cable in an up signal frequency band is provided. A first filter circuit 3 letting a signal in frequencies of 54 MHz or higher pass is provided between an input terminal 1 and an output terminal 2. A front filter circuit 4a and a rear filter circuit 4b, which constitute a second filter circuit 4, are provided on both ends of the external noise intrusion prevention device, respectively. A noise elimination circuit 6 formed by cascading two connection transformers 6a and 6b is also provided. The two connection transformers 6a and 6b are connected to each other while being arranged in a line symmetrical manner.

6 Claims, 7 Drawing Sheets

EXTERNAL NOISE INTRUSION PREVENTION DEVICE, SIGNAL AMPLIFIER, PROTECTOR AND ANTENNA PLUG

BACKGROUND OF THE INVENTION

1. Field of the Invention

The present invention relates to a technique for preventing the intrusion of external noise into an up signal on a signal transmission path which bidirectionally transmits a high frequency signal such as a bi-directional CATV system. More specifically, the present invention relates to an external noise intrusion prevention device which prevents the intrusion of external noise as well as a signal amplifier, a protector and an antenna plug each of which includes an external noise intrusion prevention circuit.

2. Description of Related Art

In a bi-directional CATV system, a frequency band of 70 MHz or higher is normally used for a down signal transmitted from a center station. A frequency band of 5 MHz to 42 MHz is used for a frequency of up signal transmitted from each subscriber's house to the center station.

The frequency band of the up signal is also a frequency band of noise produced in a home electric appliance or the like. For that reason, much noise is intruded into an up signal, which becomes a main cause for ingress noise in the center station. To reduce the ingress noise, a switching unit is conventionally provided in a trunk and, if necessary, a part of a trunk system having large noise is cut off.

However, the cutoff of the trunk system means that a line is mechanically cut off. As a result, a signal is intercepted, as well, which causes another problem. This prevention method cannot be, therefore, always used. Under these circumstances, demand for a technique which can reduce ingress noise itself, i.e., decrease or prevent the intrusion of external noise into the central conductor of a trunk cable without intercepting a signal rises.

SUMMARY OF THE INVENTION

The present invention has been made to solve the above-stated problems. It is an object of the present invention to provide an external noise intrusion prevention device capable of preventing the intrusion of external noise into the central conductor of a trunk cable in an up signal frequency band of, for example, 5 MHz to 42 MHz. It is another object of the present invention to provide a signal amplifier, a protector and an antenna plug each of which includes an external noise intrusion prevention circuit.

To attain the above object, an external noise intrusion prevention device according to one embodiment of the present invention is an external noise intrusion prevention device having an input terminal and an output terminal connectable to a coaxial cable, and including: a first filter circuit letting a signal in a predetermined frequency band pass, the input terminal and the output terminal connected to each other through the first filter circuit; a second filter circuit letting a signal in a predetermined frequency band different from the predetermined frequency band pass; and a noise elimination circuit connected between the input terminal and the output terminal through the second filter, characterized in that the noise elimination circuit is formed by cascading two connection transformers each having a primary winding and a secondary winding. The two connection transformers is a front connection transformer and a rear connection transformer, one end of the primary winding of the front connection transformer is connected to a core on the input terminal side and the other end of the primary winding of the front connection transformer is connected to an input-aide ground section. Further, one end of the secondary winding of the rear connection transformer is connected to a core on the output terminal side and the other end of the secondary winding of the rear connection transformer is connected to an output-side ground section.

An external noise intrusion prevention device according to a second embodiment of the present invention is an external noise intrusion prevention device having an input terminal and an output terminal connectable to a coaxial cable, and including: a first filter circuit letting a signal in a predetermined frequency band pass, the input terminal and the output terminal connected to each other through the first filter circuit; a second filter circuit letting a signal in a predetermined frequency band different from the predetermined frequency band pass; and a noise elimination circuit connected between the input terminal and the output terminal through the second filter, characterized in that the noise elimination circuit consists of a transformer having a turn ratio of 1 to 1. One end of a primary winding of the transformer is connected to a core on the input terminal side and the other end of the primary winding is connected to an input-side ground section. Further, one end of a secondary winding of the transformer is connected to a core on the output terminal side and the other terminal of the secondary winding is connected to an output-side ground section.

According to a third embodiment of the present invention, the noise intrusion prevent device according to the first or second embodiment is characterized in that the input-side ground section is connected to the output-side ground section to prevent a direct current from passing.

According to a fourth embodiment of the present invention, a protector is provided having an arrester and a choke coil, and preventing an abnormal voltage entering from an input terminal from flowing from an output terminal, characterized in that the protector includes an external noise intrusion prevention device according to any one of the above embodiments, the external noise intrusion prevention device provided in an output terminal section.

According to a fifth embodiment of the present invention, a signal amplifier is provided midway along a bi-directional CATV trunk letting an up signal and a down signal pass, and amplifying at least the down signal from a center station. The signal amplifier includes an external noise intrusion prevention device according to the first or second embodiment, the external noise intrusion prevention device provided in an output section outputting the down signal.

According to a sixth embodiment of the present invention, a signal amplifier is provided midway along a bi-directional CATV trunk letting an up signal and a down signal pass, and amplifying at least the down signal from a center station, characterized in that the signal amplifier includes a noise elimination circuit provided in an output section outputting the down signal. The amplifier consists of a pair of connection transformers, and the pair of connection transformer is a front connection transformer and a rear connection transformer cascaded to each other. One end of a primary winding of the front connection transformer is connected to the output section and the other end of the primary winding of the front connection transformer is connected to a ground section of the output section. Further, one end of a secondary winding of the rear connection transformer is connected to a core of an output terminal of the signal amplifier and the other end of the secondary winding of the rear connection transformer is connected to a ground section of the output terminal.

According to a seventh embodiment of the present invention, a signal amplifier is provided midway along a bi-directional CATV trunk letting an up signal and a down signal pass, and amplifying at least the down signal from a center station, characterized in that the signal amplifier includes a noise elimination circuit provided in an output section outputting the down signal. The amplifier consists of a transformer having a turn ratio of 1 to 1, and one end of a primary winding of the transformer connected to the output section and the other end of the transformer is connected to a ground section of the output section. One end of a secondary winding of the transformer is connected to a core of an output terminal of the signal amplifier and the other end of the secondary winding of the transformer is connected to a ground section of the output terminal.

According to an eight embodiment of the present invention, an antenna plug is provided having two coaxial cable connection terminals on both ends, respectively, and including an external noise intrusion prevention circuit according to any one of the first through third embodiments. The external noise intrusion prevention device interposed between the two coaxial cable connection terminals.

According to a ninth embodiment of the present invention, an antenna plug is provided having two coaxial cable connection terminals on both ends, respectively, and having an external noise intrusion prevention circuit interposed between the two coaxial cable connection terminals. The noise elimination circuit is formed by cascading two connection transformers each having a primary winding and a secondary winding. The two connection transformers are a front connection transformer and a rear connection transformer. One end of the primary winding of the front connection transformer is connected to a core of one of the coaxial cable connection terminals or one of F-type connection terminals and the other end of the primary winding of the front connection transformer is connected to a ground section of one of the coaxial cable connection terminals or one of the F-type connection terminals. Further, one end of the secondary winding of the rear connection transformer is connected to a core of the other one of the coaxial cable connection terminals or the other one of the F-type connection terminals and the other end of the secondary winding of the rear connection transformer is connected to a ground section of the other one of the coaxial cable connection terminals or the other one of the F-type connection terminals.

According to a tenth embodiment of the present invention, an antenna plug is provided having two coaxial cable connection terminals on both ends, respectively, and having an external noise intrusion prevention circuit interposed between the two coaxial cable connection terminals, characterized in that the noise elimination circuit consists of a transformer having a turn ratio of 1 to 1. Further, one end of a primary winding of the transformer is connected to a core of one of the coaxial cable connection terminals or one of F-type connection terminals and the other end of the primary winding of the transformer is connected to a ground section of one of the coaxial cable connection terminals or one of the F-type connection terminals. One end of the secondary winding of the transformer is connected to a core of the other one of the coaxial cable connection terminals or the other one of the F-type connection terminals and the other end of the secondary winding of the transformer is connected to a ground section of the other one of the coaxial cable connection terminals or the other one of the F-type connection terminals.

BRIEF DESCRIPTION OF THE DRAWINGS

FIGS. 1(*a*) and 1(*b*) show the first embodiment of an external noise intrusion prevention device according to the present invention, wherein FIG. 1(*a*) is a circuit block diagram and FIG. 1(*b*) is a circuit diagram of a noise elimination circuit shown in FIG. 1(*a*);

FIGS. 2(*a*) and 2(*b*) show another example of the noise elimination circuit shown in FIGS. 1(*a*) and 1(*b*);

FIGS. 5(*a*) and 5(*b*) are circuit block diagrams of a signal amplifier according to the present invention;

FIGS. 6(*a*) and 6(*b*) show a plug-in coaxial cable including the antenna plug according to the present invention, wherein FIG. 6(*a*) is a block diagram and FIG. 6(*b*) is an outside view;

DETAILED DESCRIPTION OF THE INVENTION

Figure 1:
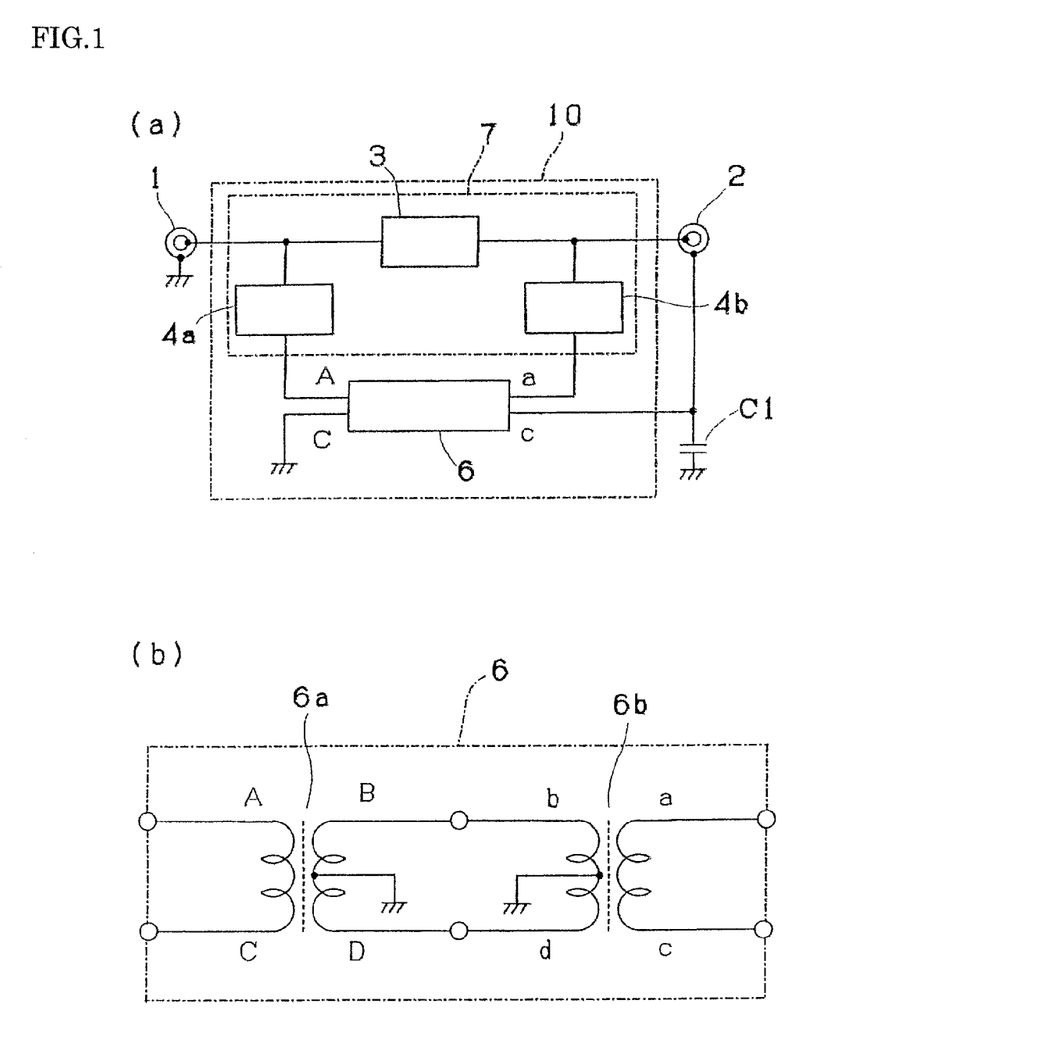

The embodiments of the present invention will be described hereinafter in detail with reference to the drawings. FIG. 1(*a*) is a circuit diagram showing the first embodiment of an external noise intrusion prevention device according to the present invention. As shown in FIG. 1(*a*), the first filter circuit 3, which let a signal in frequencies of 54 MHz or higher pass, is connected to the central conductor of an input terminal 1 and that of an output terminal 2. The second filter circuit 4, which let a signal in frequencies of 42 MHz or lower pass, and a noise elimination circuit 6 are also connected to the central conductor of the input terminal 1 and that of the output terminal 2.

The second filter circuit 4 consists of two stages formed on the both ends of the noise elimination circuit 6, respectively, i.e., a front filter circuit 4*a* and a rear filter circuit 4*b*. The front and rear filter circuits 4*a* have the same characteristic of letting a signal in frequencies of 5 to 42 MHz pass.

The first filter circuit 3 may be a high pass filter or a band pass filter, which let a signal in frequencies of 54 to 860 MHz pass. The second filter circuit 4 may be a band pass filter or a low pass filter, which let a signal in frequencies of 42 MHz or lower to pass.

The noise elimination circuit 6 is configured so that two connection transformers, i.e., a front connection transformer 6*a* and a rear connection transformer 6*b* are arranged symmetrically and cascaded as shown in FIG. 1(*b*). More specifically, the primary-side one terminal A of the front connection transformer 6*a* is connected to the front filter circuit 4*a* and the primary-side other terminal C thereof is connected to an input-side ground section. In addition, the secondary-side one terminal a of the rear connection transformer 6*b* is connected to the rear filter circuit 4*b* and the secondary-side other terminal c thereof is connected to the output terminal-side ground section. The output terminal-side ground section is connected to the input terminal-side ground section through a ground capacitor C1 which prevents the passage of a direct current. The secondary-side terminals B and D of the front connection transformer 6a are connected to the primary-side terminals b and d of the rear connection transformer 6b. The center of the secondary winding of the front connection transformer 6a and that of the primary winding of the rear connection transformer 6b are grounded.

The concrete configuration of the noise elimination circuit 6 will be described. For example, each of the front connection transformer 6a and the rear connection transformer 6b is constituted by winding a primary winding and a secondary winding around a ring-shaped ferrite core by a plurality of turns, e.g., three turns, respectively and connecting the primary winding and the secondary winding to each other while they are turned the other way relative to each other and arranged in a line symmetrical manner.

By thus connecting the transformers 6a and 6b to form the noise elimination circuit 6, neither a high frequency signal nor noise pass between the terminals A and B (a and b) and the terminals C and B (c and b) of the windings. In addition, a current flowing between the terminals A and C (a and c) can be efficiently induced to the portion between the terminals B and D (b and d).

Next, the function of the external noise intrusion prevention device when noise enters the device from the output terminal 2 of the circuit 10 shown in FIG. 1(a) will be described. When external noise enters the external conductor of an output-side coaxial cable, the noise current flows into the ground through the ground capacitor C1. In addition, the noise current is to flow into one terminal c of the secondary winding of the rear connection transformer 6b. However, since the other terminal a is higher in potential than the noise current, the noise current cannot flow into the secondary winding.

This noise current appears on one terminal b or the other terminal d of the primary winding of the rear connection transformer 6b not by induction but by the distributed capacitance between the windings. Even if such noise current appears on one terminal b or the other terminal d of the primary winding of the rear connection transformer 6b, both the noise current propagated from the terminal d to the terminal D and the noise current propagated from the terminal b to the terminal B appear on the terminal C. The noise current appears because of the reversibility of the front connection transformer 6a, which is arranged to be turned the other way relative to the rear transformer 6b. As a result, the noise current can be relieved to the ground having a lower potential.

Therefore, it is possible to attain a low noise intrusion rate. In addition, only with the simple configuration in which the two connection transformers are connected to each other while being turned the other way relative to each other, it is possible to eliminate external noise flowing into an up signal. A down signal flows through the first filter circuit 3 and does not flow in the noise elimination circuit 6.

Figure 2:
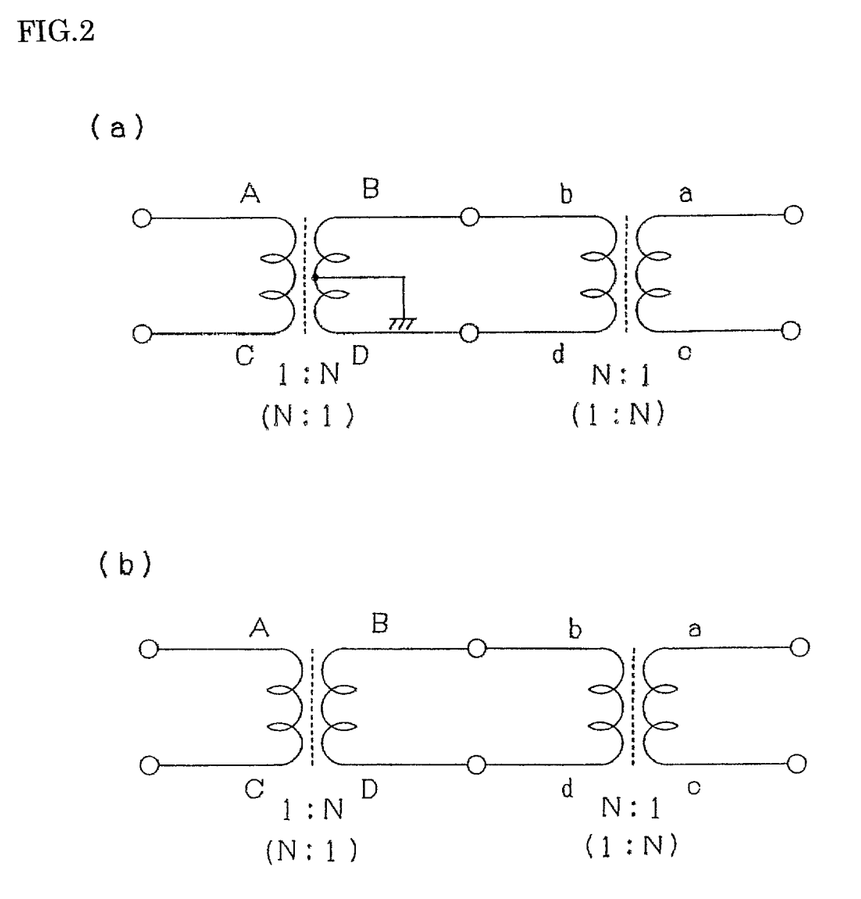

The turn ratio of the primary winding to the secondary winding of each connection transformer may be 1 to 1 or not. As shown in FIG. 2, the primary winding and the secondary winding may be formed at a turn ratio of 1 to N (where N is an integer). In that case, the rear connection transformer may be set to have a turn ratio of N to 1 symmetrical to the turn ratio of the front connection transformer. Further, one of or both of the centers of the windings are not necessarily grounded. In addition, as long as the both transformers have the same characteristic in a target noise frequency range, one may have low pass characteristic and the other may have high pass characteristic. By doing so, it is possible to maintain good transformer characteristic in a wide frequency range.

Figure 3:
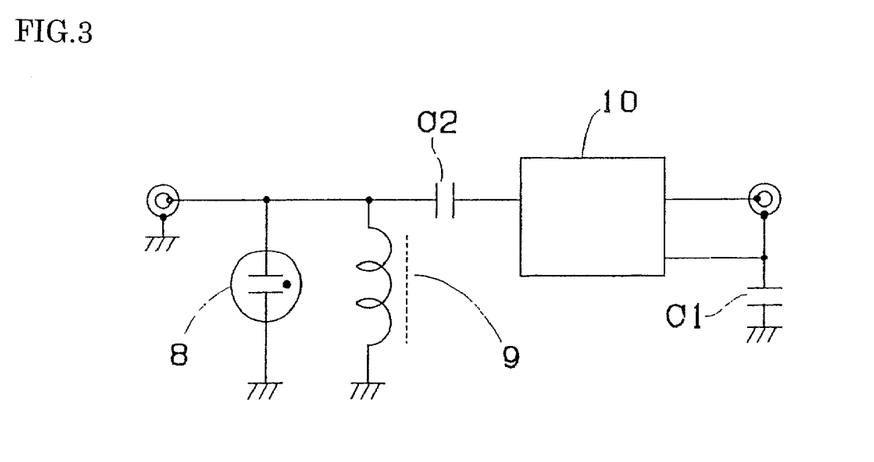
FIG. 3 is a circuit block diagram showing one example of a protector according to the present invention.

FIG. 3 is a block diagram showing one example of a protector provided with the circuit of the above-stated external noise intrusion prevention device. The external noise intrusion prevention circuit 10 shown in FIG. 1(a) is connected to the output side of a lightning circuit on which an arrester 8 and a choke coil 9 are provided. As can be seen, only by providing the protector which protects a terminal equipment such as a television receiver from high voltage such as a lightning stroke, it is possible to prevent the intrusion of external noise entering from the terminal equipment into a trunk.

Figure 4:
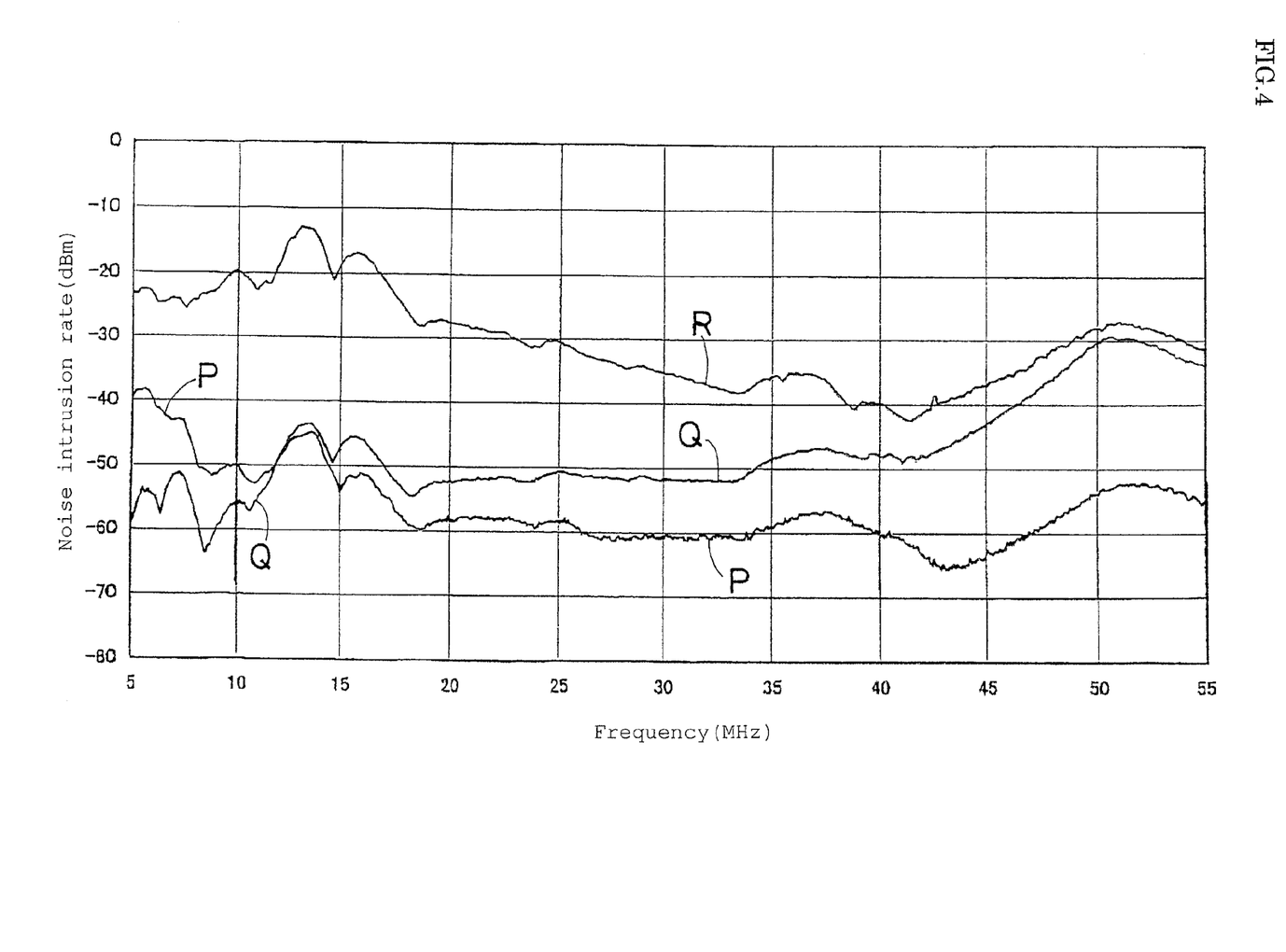
FIG. 4 is a chart showing the noise intrusion rate-frequency characteristic of the protector shown in FIG. 3.

FIG. 4 shows the noise intrusion rate characteristic of the protector shown in FIG. 3. A symbol P denotes the noise intrusion rate characteristic of the protector when the ground capacitor C1 (through capacitor) is connected to the protector, Q denotes the noise intrusion rate characteristic of the protector if the ground capacitor C1 is not connected, and R denotes the characteristic of a conventional protector which is provided with the external noise intrusion prevention circuit.

As shown in FIG. 4, the characteristics P and Q are crossed with a frequency around 12 MHz because of the presence and absence of the ground capacitor C1. However, it is seen that the protector of the present invention is superior to the conventional protector in the elimination of external noise in a frequency band of 5 to 42 MHz.

It is noted that the noise intrusion rate characteristic is obtained by applying a signal corresponding to noise, between the output-side ground section and the input-side ground section and measuring the attenuation of the noise corresponding signal which appears between the core of the input terminal 1 and the ground. In any protector, the front connection transformer 6a has the primary winding wound by three turns and the secondary winding wound horizontally about a neutral point by three turns. In addition, the rear connection transformer 6b is turned the other way relative to the front connection transformer 3.

FIGS. 5(a) and 5(b) are block diagrams showing one example of a signal amplifier (or booster) according to the present invention. FIG. 5(a) shows the configuration of the signal amplifier in which the external noise intrusion prevention circuit 10 described above is connected to the output of an amplification circuit 12. FIG. 5(b) shows the configuration thereof in which the circuit 6 shown in FIG. 1(b) without filter circuits is connected to the output of the amplification circuit 12. In FIG. 5(a), capacitors C3 and C4 provided on the both ends of the external noise intrusion prevention circuit 10, respectively, are DC cutoff capacitors, reference symbol 13 denotes a DC pass coil and 14 denotes a power supply plug.

When the signal amplifier or booster provided in the middle of a CATV trunk is constituted as stated above, it is possible to easily eliminate external noise entering between the booster and the protector. In addition, as shown in FIG. 5(b), the filter circuits may be removed. In that case, circuit design becomes difficult; however, it is possible to eliminate external noise in a wide frequency band. While the DC pass circuit 13 is provided in FIG. 5(a), it suffices to provide only the external noise intrusion prevention circuit 10 on the output of the amplifier circuit or booster 12 if it is not necessary to provide the DC pass circuit 13.

FIGS. 6(a) and 6(b) are explanatory views for a coaxial cable with plugs which shows one example of an antenna plug according to the present invention. FIG. 6(a) is a block diagram and FIG. 6(b) is a schematic outside view. In FIGS. 6(a) and 6(b), an antenna plug 16 on the right includes the external noise intrusion prevention circuit 10. An antenna plug 17 on the left is a conventional antenna plug connected to a coaxial cable 18.

When the antenna plugs are thus constituted, the external noise intrusion prevention circuit is included in one of the antenna plugs of the coaxial cable with plugs. Further, one end of the coaxial cable is connected to a serial unit provided on a wall surface or the like and the other end thereof is connected to a television receiver, then it is possible to eliminate external noise entering from the antenna terminal of the television receiver without the need to separately provide an external noise intrusion prevention device. It is also possible to prevent noise produced in the television receiver from intruding from the antenna terminal of the television receiver into a CATV system.

The external noise intrusion prevention circuit may be constituted to exclude the filter circuits and included in the antenna plug or constituted to exclude the ground capacitor C1. In FIG. 1, the frequency characteristics of the respective filter circuits are specified. However, if a down signal frequency band differs from an up signal frequency band, the respective filter characteristics maybe determined in accordance with the frequencies.

Figure 7:
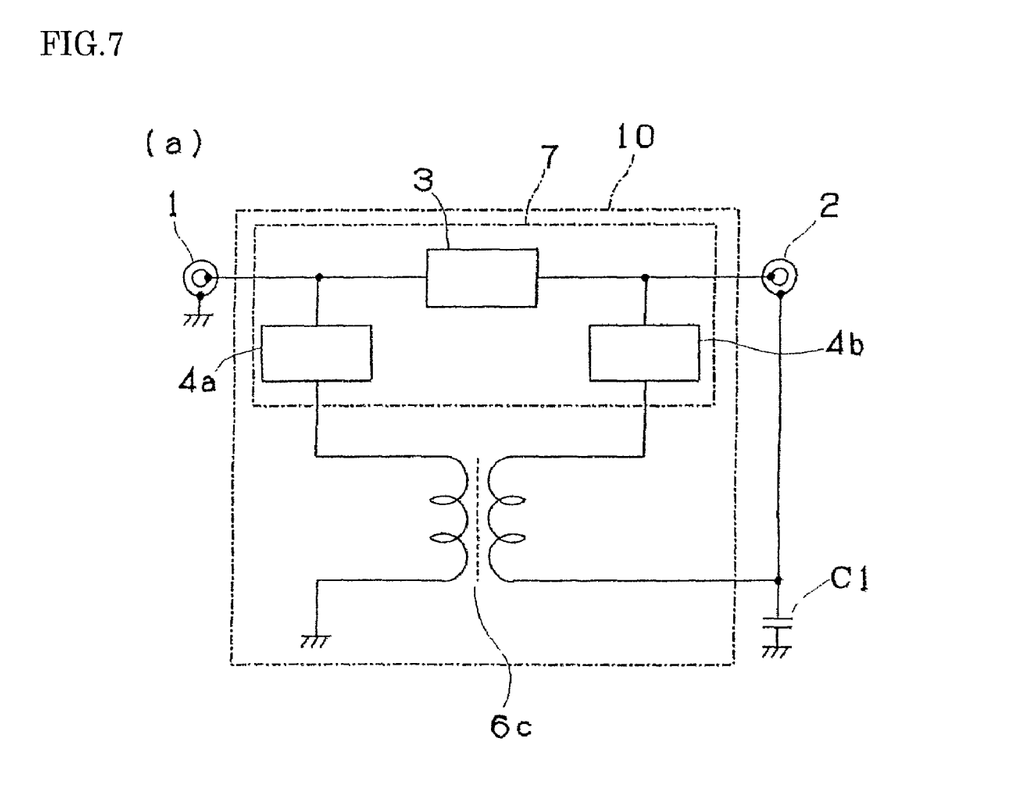
FIG. 7 is a circuit block diagram showing the second embodiment of an external noise intrusion prevention device according to the present invention.

FIG. 7 is a circuit block diagram which shows the second embodiment of the external noise intrusion prevention circuit according to the present invention. The difference between the external noise intrusion prevention circuit shown in FIG. 7 and that shown in FIG. 1 is the configuration of the noise elimination circuit 6. In case of FIG. 7, the noise elimination circuit 10 is formed out of a transformer 6c having a turn ratio of 1 to 1. More specifically, the transformer 6c is constituted so that a primary winding and a secondary winding are wound around a ring-shaped ferrite core by five turns, respectively.

Figure 8:
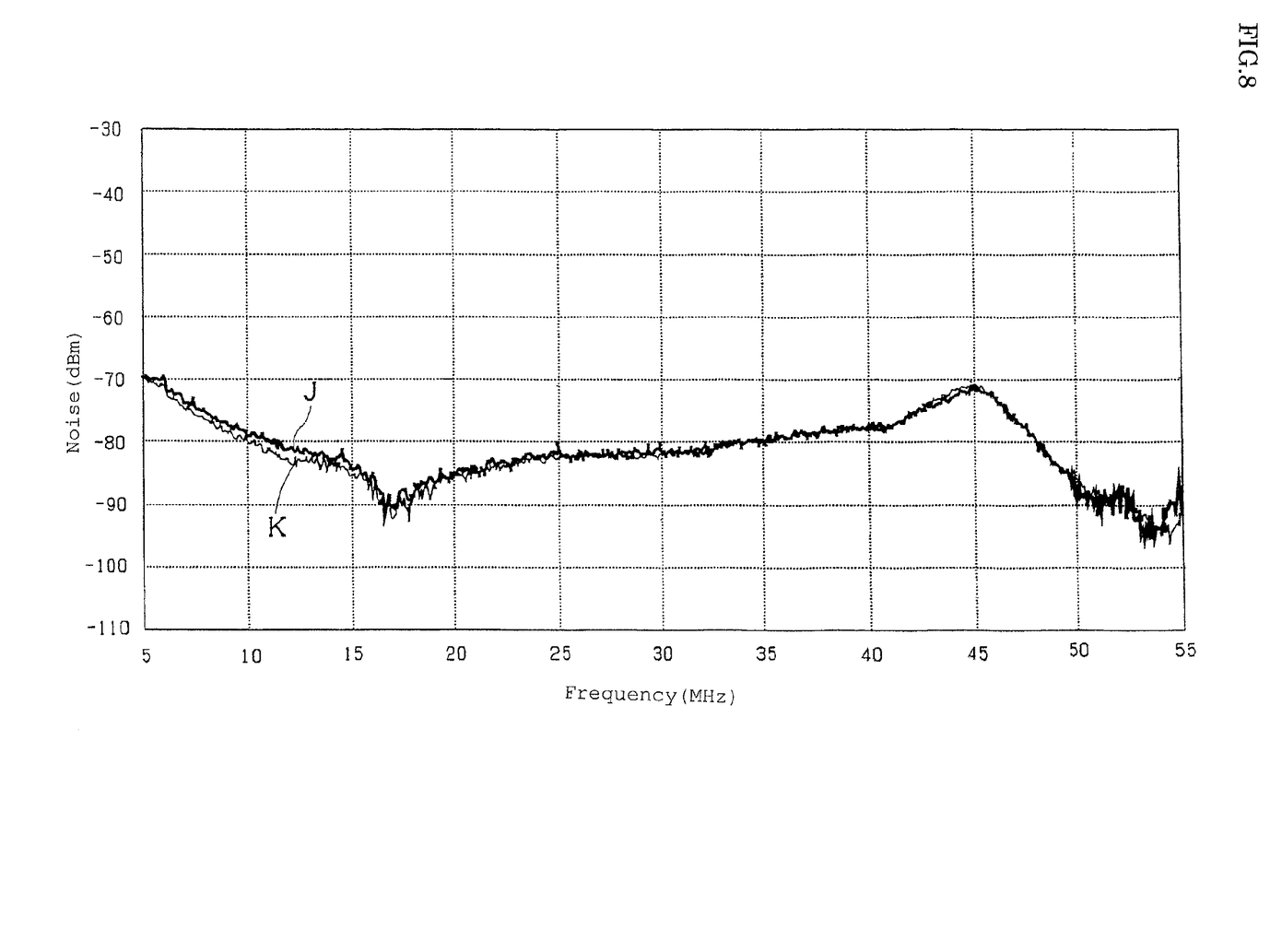
FIG. 8 is a characteristic graph showing the noise intrusion rate characteristics of the external noise intrusion prevention devices shown in FIGS. 1 and 7, respectively.

FIG. 8 shows the comparison in the noise intrusion rate characteristic of the external noise intrusion prevention device between the configuration shown in FIG. 7 and that shown in FIG. 1. The noise intrusion rate characteristics shown in FIG. 8 are measured by the same method as that of the characteristics shown in FIG. 4. That is to say, these characteristics are obtained each by applying a signal corresponding to noise, between the output-side ground section and the input-side ground section and measuring the attenuation of the noise corresponding signal appearing between the core of the input terminal 1 and the ground. In FIG. 8, a thick curve J indicates the characteristics of the device shown in FIG. 7 and a thin curve K indicates the characteristic of the device shown in FIG. 1. It is noted that the front transformer has a turn ratio of 5 to 7 and the rear transformer has a turn ratio of 7 to 5 in the device having the characteristic K.

As shown in FIG. 8, even if the transformer 6c having a turn ratio of 1 to 1 is used as the noise elimination circuit, the characteristic J is lower than the characteristic K by 2 to 3 dB with frequencies of 20 MHz or lower. However, the device show in FIG. 7 can obtain a similar effect to that of the device shown in FIG. 1 and prevent the intrusion of noise. In addition, it suffices to use only one transformer in the device shown in FIG. 7, thereby making it possible to effectively utilize space and reduce cost.

Figure 5:
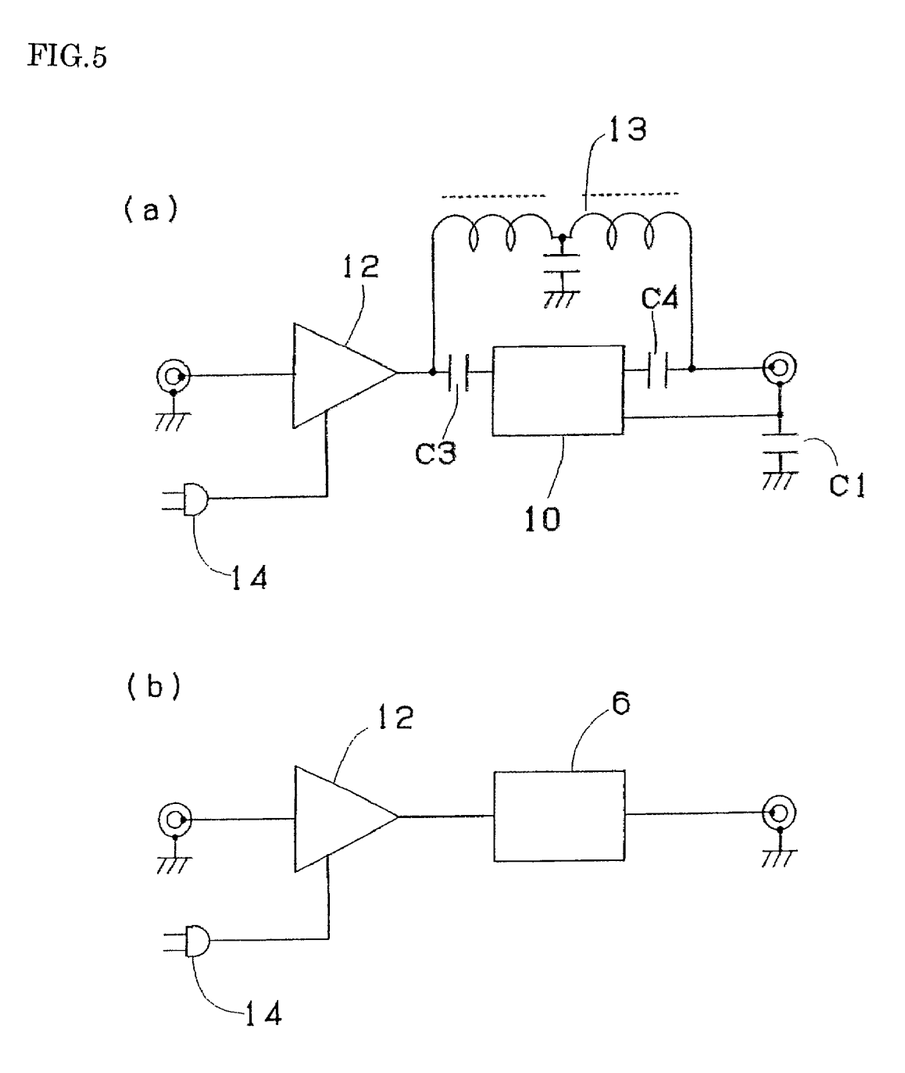
Figure 6:
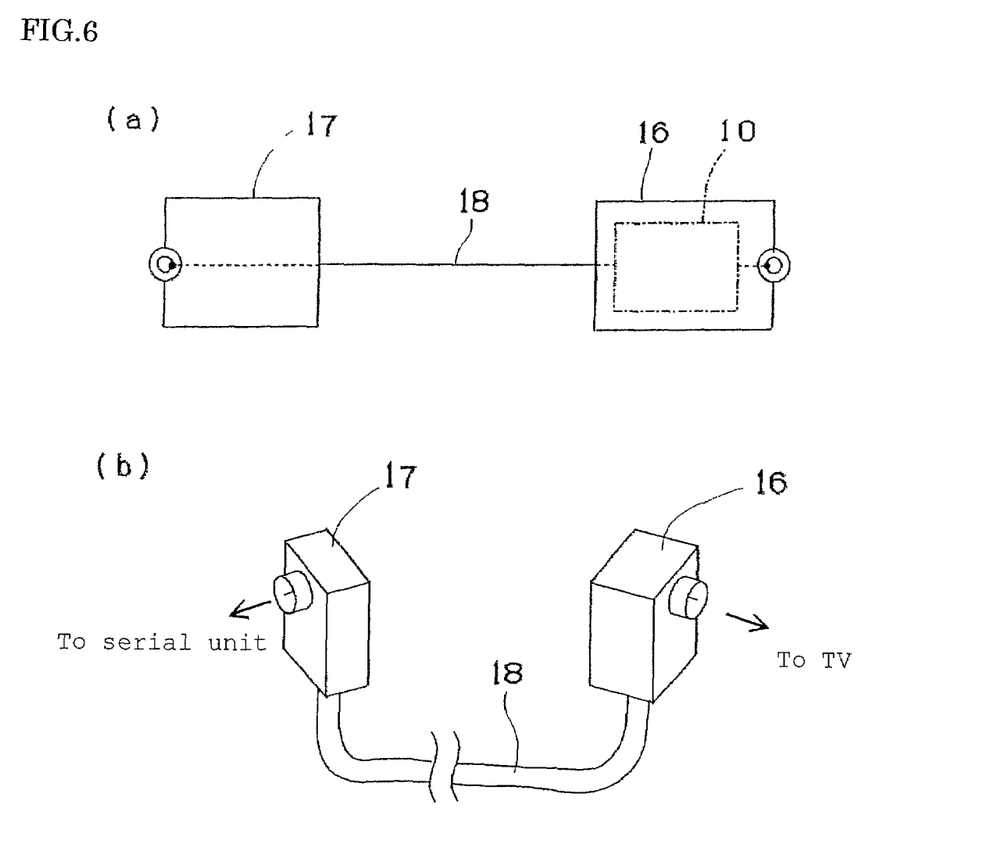

Accordingly, when a protector as shown in FIG. 3 is formed using an external noise intrusion prevention circuit formed out of this transformer 6c having a turn ratio of 1 to 1, it is possible to prevent the intrusion of noise from a terminal equipment into a trunk. Likewise, when a signal amplifier as shown in FIG. 5 is formed using this external noise intrusion prevention circuit, it is possible to eliminate external noise entering between a signal amplifier and a protector provided on a trunk. Furthermore, when an antenna plug as shown in FIG. 6 is formed using this external noise intrusion prevention circuit, it is possible to prevent noise produced in a television receiver from intruding from the antenna terminal of the television receiver into a CATV system.

The external noise intrusion prevention circuit in the signal amplifier or the antenna plug in this case may be formed out of only the noise elimination circuit without filter circuits.

As stated so far in detail, the external noise intrusion prevention device according to the first through third embodiment of the present invention can prevent the intrusion of noise in an up signal frequency band with a simple configuration. In addition, when filter circuits are provided, it is possible to design the circuit for limited frequencies and to thereby simplify circuit design.

The protector according to the the fourth embodiment of the present invention can eliminate noise intruded between the terminal equipment such as a television receiver and the protector besides the inherent function as the protector.

The signal amplifier according to the fifth through seventh embodiment of the present invention can eliminate intruded noise between the signal amplifier and the protector.

The antenna plug according to the eight through tenth embodiment of the present invention can eliminate external noise intruded into the antenna terminal of the television receiver only if the antenna plug is connected to the television receiver. In addition, the antenna plug can prevent noise produced in the television receiver from intruding from the antenna terminal of the television receiver into the CATV system.

What is claimed is:

1. An external noise intrusion prevention device having input and output terminals adapted to be connected to a coaxial cable, the external noise intrusion prevention device comprising:
   a first filter circuit that passes a signal in a first predetermined frequency band and connects the input terminal and the output terminal to each other;
   a second filter circuit that passes a signal in a second predetermined frequency band that is different from the first predetermined frequency band; and
   a noise elimination circuit connected between the input terminal and the output terminal through the second filter circuit, wherein the noise elimination circuit is formed by cascading a front connection transformer and a rear connection transformer, each having a primary winding and a secondary winding, wherein one end of the primary winding of the front connection transformer is connected to a core on the input terminal side and the other end of the primary winding of the front connection transformer is connected to an input-side ground section, and wherein one end of the secondary winding of the rear connection transformer is connected to a core on the output terminal side and the other end of the secondary winding of the rear connection transformer is connected to an output-side ground section.

2. An external noise intrusion prevention device having input and output terminals adapted to be connected to a coaxial cable, the external noise intrusion prevention device comprising:

a first filter circuit that passes a signal in a first predetermined frequency band, and connects the input terminal and the output terminal to each other;

a second filter circuit that passes a signal in a second predetermined frequency band that is different from the first predetermined frequency band; and a noise elimination circuit connected between the input terminal and the output terminal though the second filter circuit, the noise elimination circuit consisting of a transformer having a 1:1 turn ratio, wherein one end of a primary winding of the transformer is connected to a core on the input terminal side and the other end of the primary winding is connected to an input-side ground section, and wherein one end of a secondary winding of the transformer is connected to a core on the output terminal side and the other end of the secondary winding is connected to an output-side ground section.

3. An external noise intrusion prevention device according to claim 1, wherein the input side ground section is connected to the output-side ground section to prevent a direct current from passing.

4. A protector comprising:

an arrester;

a choke coil; and an external noise intrusion prevention device having an input terminal and an output terminal adapted to be connected to a coaxial cable, the external noise intrusion prevention device comprising a first filter circuit that passes a signal in a first predetermined frequency band and connects the input terminal and the output terminal to each other, a second filter circuit that passes a signal in a second predetermined frequency band that is different from the first predetermined frequency band, and a noise elimination circuit connected between the input terminal and the output terminal through the second filter circuit, wherein the noise elimination circuit is formed by cascading a front connection transformer and a rear connection transformer each having a primary winding and a secondary winding, wherein one end of the primary winding of the front connection transformer is connected to a core on said input terminal side and the other end of the primary winding of the front connection transformer is connected to an input-side around section, and wherein one end of the secondary winding of the rear connection transformer is connected to a core on said output terminal side and the other end of the secondary winding of the rear connection transformer is connected to an output-side ground section;

wherein the external noise intrusion prevention device is provided on an output terminal section; and wherein the protector prevents an abnormal voltage that enters from an input terminal from flowing out the output terminal.

5. A signal amplifier provided midway along a bi-directional CATV trunk that allows an up signal and a down signal to pass and amplifies at least the down signal from a center station, the signal amplifier comprising:

an external noise intrusion prevention device having an input terminal and an output terminal adapted to be connected to a coaxial cable, the external noise intrusion prevention device comprising a first filter circuit that passes a signal in a first predetermined frequency band and that connects the input terminal and the output terminal to each other, a second filter circuit that passes a signal in a second predetermined frequency band that is different from the first predetermined frequency band, and a noise elimination circuit connected between the input terminal and the output terminal through the second filter circuit, wherein the noise elimination circuit is formed by cascading a front connection transformer and a rear connection transformer each having a primary winding and a secondary winding, wherein one end of the primary winding of the front connection transformer is connected to a core on said input terminal side and the other end of the primary winding of the front connection transformer is connected to an input-side ground section, and wherein one end of the secondary winding of the rear connection transformer is connected to a core on said output terminal side and the other end of the secondary winding of the rear connection transformer is connected to an output-side ground section;

wherein the external noise prevention device is provided in an output section that outputs the down signal.

6. An antenna plug having two coaxial cable connection terminals provide on both ends thereof, respectively, and an external noise intrusion prevention device interposed between the two coaxial cable connection terminals and having an input terminal and an output terminal adapted to be connected to a coaxial cable, the external noise intrusion prevention device comprising a first filter circuit that passes a signal in a first predetermined frequency band and connects the input terminal and the output terminal to each other, a second filter circuit that passes a signal in a second predetermined frequency band that is different from the first predetermined frequency band, and a noise elimination circuit connected between the input terminal and the output terminal through the second filter circuit, wherein the noise elimination circuit is formed by cascading a front connection transformer and a rear connection transformer each having a primary winding and a secondary winding, wherein one end of the primary winding of the front connection transformer is connected to a core on said input terminal side and the other end of the primary winding of the front connection transformer is connected to an input-side ground section, and wherein one end of the secondary winding of the rear connection transformer is connected to a core on said output terminal side and the other end of the secondary winding of the rear connection transformer is connected to an output-side ground section.

* * * * *

UNITED STATES PATENT AND TRADEMARK OFFICE
CERTIFICATE OF CORRECTION

PATENT NO.        : 7,039,360 B2
APPLICATION NO.   : 10/054187
DATED             : May 2, 2006
INVENTOR(S)       : Toshihiro Sugiura It is certified that error appears in the above-identified patent and that said Letters Patent is hereby corrected as shown below:

Title Page

Item (30)   Foreign Application Priority Data
Please add: --Jan. 22, 2001   (JP) .................. 2001-13688--

Item (57)   Abstract
*Line 1*: please change "preventing" to --is provided to prevent--
*Line 4*: please change "3 letting a signal in" to --allows signals having--
*Line 5*: please delete "1"
*Line 6*: please delete "2," "4d," and "4b"
*Line 7*: please delete "4"
*Line 9*: please delete "6"
*Lines 10 and 11*: please delete "6a and 6b"

Column 1
*Line 1*: please add --This application claims priority from Japanese Application 2001-13688, filed January 22, 2001, the entirety of which is incorporated herein by reference.--

Column 2

*Line 31*: please change "embodiment" to --embodiments--
*Lines 47-48*: please change "embodiment" to --embodiments above--

Column 3

*Line 19*: please change "eight" to --eighth--
*Line 24*: please add --is-- after "device"

UNITED STATES PATENT AND TRADEMARK OFFICE
CERTIFICATE OF CORRECTION

PATENT NO. : 7,039,360 B2
APPLICATION NO. : 10/054187
DATED : May 2, 2006
INVENTOR(S) : Toshihiro Sugiura It is certified that error appears in the above-identified patent and that said Letters Patent is hereby corrected as shown below:

Column 8

*Lines 17, 27, 30*: please change "embodiment" to --embodiments--
*Line 22*: please delete the third occurrence of "the"
*Line 29*: please change "eight" to --eighth--

Column 9

*Line 8*: please change "though" to --through--
*Line 45*: please change "around" to --ground--

Column 10

*Line 27*: please add --intrusion-- after "noise"
*Line 30*: please change "provide" to --provided--

Signed and Sealed this

Seventeenth Day of October, 2006

JON W. DUDAS
*Director of the United States Patent and Trademark Office*